US009627592B2

(12) United States Patent
Skipor et al.

(10) Patent No.: US 9,627,592 B2
(45) Date of Patent: Apr. 18, 2017

(54) APPARATUS AND METHOD FOR MODULATING PHOTON OUTPUT OF A QUANTUM DOT LIGHT EMITTING DEVICE

(71) Applicant: SAMSUNG ELECTRONICS CO., LTD., Suwon-si (KR)

(72) Inventors: Andrew F. Skipor, West Chicago, IL (US); Jerzy Wielgus, Mount Prospect, IL (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/853,331

(22) Filed: Sep. 14, 2015

(65) Prior Publication Data
US 2016/0072025 A1  Mar. 10, 2016

Related U.S. Application Data

(63) Continuation of application No. 11/769,040, filed on Jun. 27, 2007, now Pat. No. 9,136,498.

(51) Int. Cl.
*H01L 27/15* (2006.01)
*H01L 29/26* (2006.01)
(Continued)

(52) U.S. Cl.
CPC ............ *H01L 33/502* (2013.01); *B82Y 20/00* (2013.01); *G02B 26/02* (2013.01); *H01L 33/00* (2013.01);
(Continued)

(58) Field of Classification Search
CPC ............................ H01L 33/0004; G02B 26/02
(Continued)

(56) References Cited

U.S. PATENT DOCUMENTS 5,442,254 A  8/1995 Jaskie
5,537,000 A  7/1996 Alivisatos et al.
(Continued)

FOREIGN PATENT DOCUMENTS

WO  WO 2009/002760 A2  12/2008
WO  WO 2009/0027760 A3  12/2008

OTHER PUBLICATIONS

Coe, S., et al., "Electroluminescence from single monolayer of nanocrystals in molecular organic devices", Nature, vol. 420, 19/26 Dec. 2002.
(Continued)

*Primary Examiner* — David Vu
*Assistant Examiner* — Brandon Fox
(74) *Attorney, Agent, or Firm* — Cantor Colburn LLP

(57) ABSTRACT

An apparatus is provided for modulating the photon output of a plurality of free standing quantum dots. The apparatus comprises a first electron injection layer (210, 310, 410) disposed between a first electrode (212, 312, 412) and a layer (208, 308, 408) of the plurality of free standing quantum dots. A hole transport layer (206, 306, 406) is disposed between the layer (208, 308, 408) of the plurality of quantum dots and a second electrode (204, 304, 404). A light source (224, 324, 424) is disposed so as to apply light to the layer (208, 308, 408) of the plurality of free standing quantum dots. The photon output of the layer (208, 308, 408) of the plurality of free standing quantum dots is modulated by applying a voltage to the first and second electrodes (212, 312, 412, 204, 304, 404). Electrons excited to a higher energy state within layer (208, 308, 408) of the free standing quantum dots by the light source (224, 324, 424) are prevented from returning to a lower state by electrons from the electric field of the applied voltage, and therefore the free standing quantum dots are prevented from emitting a pho-
(Continued)

ton. The voltage source (216, 316, 416) may be modulated to vary the photon output.

5 Claims, 3 Drawing Sheets

(51) Int. Cl.

| | | |
|---|---|---|
| *H01L 33/00* | (2010.01) | |
| *H01L 33/50* | (2010.01) | |
| *G02B 26/02* | (2006.01) | |
| *B82Y 20/00* | (2011.01) | |
| *H01L 51/50* | (2006.01) | |
| *H01L 51/52* | (2006.01) | |
| *H01L 33/14* | (2010.01) | |
| *H01L 27/32* | (2006.01) | |

(52) U.S. Cl.
CPC .......... *H01L 33/0004* (2013.01); *H01L 33/14* (2013.01); *H01L 51/5012* (2013.01); *H01L 51/52* (2013.01); *H01L 27/3209* (2013.01); *H01L 2933/0083* (2013.01); *Y10S 977/774* (2013.01); *Y10S 977/95* (2013.01)

(58) Field of Classification Search
USPC ............................................ 257/79; 315/291
See application file for complete search history.

(56) References Cited

U.S. PATENT DOCUMENTS

| | | | |
|---|---|---|---|
| 5,613,140 A | 3/1997 | Taira | |
| 5,958,573 A | 9/1999 | Spitler | |
| 6,005,707 A | 12/1999 | Berggren et al. | |
| 6,236,060 B1 | 5/2001 | Chan et al. | |
| 6,294,401 B1 | 9/2001 | Jacobson et al. | |
| 6,728,281 B1* | 4/2004 | Santori .................. | B82Y 10/00 257/13 |
| 6,803,719 B1 | 10/2004 | Miller et al. | |
| 6,864,626 B1* | 3/2005 | Weiss .................... | B82Y 20/00 252/299.01 |
| 6,890,777 B2 | 5/2005 | Bawendi et al. | |
| 6,914,265 B2 | 7/2005 | Bawendi et al. | |
| 9,136,498 B2 | 9/2015 | Skipor et al. | |
| 2001/0039066 A1 | 11/2001 | Hoon | |
| 2003/0230970 A1 | 12/2003 | Steckl et al. | |
| 2004/0023010 A1 | 2/2004 | Bulovic et al. | |
| 2004/0245912 A1* | 12/2004 | Thurk .................. | C09K 11/02 313/484 |
| 2004/0259363 A1 | 12/2004 | Bawendi et al. | |
| 2005/0088380 A1 | 4/2005 | Bulovic et al. | |
| 2005/0236556 A1 | 10/2005 | Sargent et al. | |
| 2005/0266697 A1* | 12/2005 | Korgel .................. | B82Y 10/00 438/758 |
| 2006/0034065 A1 | 2/2006 | Thurk et al. | |
| 2006/0065902 A1* | 3/2006 | Todori .................. | B82Y 20/00 257/79 |
| 2006/0081862 A1 | 4/2006 | Chua et al. | |
| 2007/0103068 A1 | 5/2007 | Bawendi et al. | |
| 2007/0181898 A1 | 8/2007 | Chik et al. | |
| 2008/0057342 A1* | 3/2008 | Sekiya .................. | B82Y 20/00 428/690 |
| 2008/0074050 A1 | 3/2008 | Chen et al. | |
| 2008/0169753 A1 | 7/2008 | Skipor et al. | |
| 2008/0172197 A1 | 7/2008 | Skipor et al. | |
| 2009/0001403 A1 | 1/2009 | Skipor et al. | |
| 2009/0002806 A1 | 1/2009 | Skipor et al. | |
| 2009/0017268 A1 | 1/2009 | Skipor et al. | |
| 2009/0059554 A1 | 3/2009 | Skipor et al. | |
| 2009/0174022 A1 | 7/2009 | Coe-Sullivan et al. | |
| 2009/0278141 A1 | 11/2009 | Coe-Sullivan et al. | |
| 2009/0283778 A1 | 11/2009 | Coe-Sullivan et al. | |
| 2010/0001256 A1 | 1/2010 | Coe-Sullivan et al. | |
| 2010/0025595 A1 | 2/2010 | Bawendi et al. | |
| 2010/0051901 A1 | 3/2010 | Kazlas et al. | |
| 2010/0134520 A1 | 6/2010 | Coe-Sullivan et al. | |
| 2010/0243053 A1 | 9/2010 | Coe-Sullivan et al. | |
| 2010/0283036 A1 | 11/2010 | Coe-Sullivan et al. | |
| 2010/0283072 A1 | 11/2010 | Kazlas et al. | |
| 2011/0140075 A1 | 6/2011 | Zhou et al. | |
| 2011/0180782 A1 | 7/2011 | Fattal et al. | |
| 2011/0299001 A1 | 12/2011 | Banin et al. | |

OTHER PUBLICATIONS

Huang, H., et al., "Bias-Induced Photoluminescence Quenching of Single Colloidal Quantum Dots Embedded in Organic Semiconductors", Nano Letters, 2007, vol. 7, No. 12, 3781-3786.

Moeller, g., et al., "Quantum-Dot Light-Emitting Devices for Displays", Information Display, Feb. 2006.

PCT International Search Report and Written Opinion, SIPO, ISA/KR, Korean Intellectual Property Office, Daejeon, Republic of Korea, Dec. 22, 2008.

Sargent, E.H., "Infrared Quantum Dots", Adv. Mater., 2005, 17, No. 5, Mar. 8.

Woo, W-K, et al., "Reversible Charging of CdSe Nanocrystals in a Simple Solid-State Device", Adv. Mater., 2002, 14, No. 15, Aug. 5, pp. 1068-1071.

* cited by examiner

APPARATUS AND METHOD FOR MODULATING PHOTON OUTPUT OF A QUANTUM DOT LIGHT EMITTING DEVICE

This application is a continuation of U.S. patent application Ser. No. 11/769,040, filed 27 Jun. 2007, which is hereby incorporated herein by reference in its entirety.

FIELD OF THE INVENTION

The present invention generally relates to light emitting devices and more particularly to a method for adjusting the photon output of quantum dots.

BACKGROUND OF THE INVENTION

Free standing quantum dots (FSQDs) are semiconductor nanocrystallites whose radii are smaller than the bulk exciton Bohr radius and constitute a class of materials intermediate between molecular and bulk forms of matter. FSQDs are known for the unique properties that they possess as a result of both their small size and their high surface area. For example, FSQDs typically have larger absorption cross-sections than comparable organic dyes, higher quantum yields, better chemical and photo-chemical stability, narrower and more symmetric emission spectra, and a larger Stokes shift. Furthermore, the absorption and emission properties vary with the particle size and can be systematically tailored. It has been found that a Cadmium Selenium (CdSe) quantum dot, for example, can emit light in any monochromatic, visible color, where the particular color characteristic of that dot is dependent on the size of the quantum dot.

FSQDs are easily incorporated into or on other materials such as polymers and polymer composites because FSQDs are highly soluble and have little degradation over time. These properties allow FSQD polymers and polymer composites to provide very bright displays, returning almost 100% quantum yield.

Applications for FSQD polymers and polymer composites include point of purchase and point of sale posters, mobile device housings or logos, segmented displays, including ultraviolet (UV) and infrared (IR) displays, absorbers for UV and IR sensors or detectors, and light emitting diodes (LEDs). Although the visible advantages inherent to FSQD polymers and polymer composites are attractive, control of the output (light intensity) is problematic.

Accordingly, it is desirable to provide an apparatus and method of modulating the photon output of a FSQD light emitting device. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
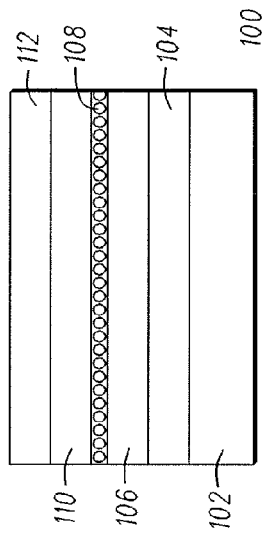
FIG. 1 is a schematic partial cross section illustrating a previously known free standing quantum dot display.

The following detailed description of the invention is merely exemplary in nature and is not intended to limit the invention or the application and uses of the invention. Furthermore, there is no intention to be bound by any theory presented in the preceding background of the invention or the following detailed description of the invention.

Quantum Dots (QDs), also known as nanocrystals or Freestanding Quantum Dots (FSQD), are semiconductors composed of periodic groups of II-VI, III-V, or IV-VI materials, for example, CdS, CdSe, CdTe, ZnS, ZnSe, ZnTe, GaAs, GaP, GaAs, GaSb, HgS, HgSe, HgTe, InAs, InP, InSb, AlAs, AlP, AlSb. Alternative FSQDs materials that may be used include but are not limited to tertiary microcrystals such as InGaP, which emits in the yellow to red wavelengths (depending on the size) and ZnSeTe, ZnCdS, ZnCdSe, and CdSeS which emits from blue to green wavelengths. Multi-core structures are also possible such as ZnSe/ZnXS/ZnS, are also possible where X represents Ag, Sr, Te, Cu, or Mn. The inner most core is made of ZnSe, followed by the second core layer of ZnXS, completed by an external shell made of ZnS.

FSQDs range in size from 2-10 nanometers in diameter (approximately $10^2$-$10^7$ total number of atoms). At these scales, FSQDs have size-tunable band gaps, in other words there spectral emission depends upon size. Whereas, at the bulk scale, emission depends solely on the composition of matter. Other advantages of FSQDs include high photoluminescence quantum efficiencies, good thermal and photo-stability, narrow emission line widths (atom-like spectral emission), and compatibility with solution processing. FSQDs are manufactured conventionally by using colloidal solution chemistry.

FSQDs may be synthesized with a wider band gap outer shell, comprising for example ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, MN, AlP, AlSb. The shell surrounds the core FSQDs and results in a significant increase in the quantum yield. Capping the FSQDs with a shell reduces non-radiative recombination and results in brighter emission. The surface of FSQDs without a shell has both free electrons in addition to crystal defects. Both of these characteristics tend to reduce quantum yield by allowing for non-radiative electron energy transitions at the surface. The addition of a shell reduces the opportunities for these non-radiative transitions by giving conduction band electrons an increased probability of directly relaxing to the valence band. The shell also neutralizes the effects of many types of surface defects. The FSQDs are more thermally stable than organic phosphors since UV light will not chemically breakdown FSQDs. The exterior shell can also serve as an anchor point for chemical bonds that can be used to modify and functionalize the surface.

Due to their small size, typically on the order of 10 nanometers or smaller, the FSQDs have larger band gaps relative to a bulk material. It is noted that the smaller the FSQDs, the higher the band gap. Therefore, when impacted by a photon (emissive electron-hole pair recombination), the smaller the diameter of the FSQDs, the shorter the wavelength of light will be released. Discontinuities and crystal defects on the surface of the FSQD result in non-radiative recombination of the electron-hole pairs that lead to reduced or completely quenched emission of the FSQD. An overcoating shell, e.g., ZnS, having a thickness, e.g., of up to 5 monolayers and higher band gap compared to the core's band gap is optionally provided around the FSQDs core to reduce the surface defects and prevent this lower emission efficiency. The band gap of the shell material should be larger than that of the FSQDs to maintain the energy level of the FSQDs. Capping ligands (molecules) on the outer surface of the shell allow the FSQDs to remain in the colloidal suspension while being grown to the desired size. The FSQDs may then be placed within the display by a printing process, for example. Additionally, a light (radiation) source (preferably a ultra violet (UV) source) is disposed to selectively provide photons to strike the FSQDs, thereby causing the FSQDs to emit a photon at a frequency comprising the specific color as determined by the size tunable band gap of the FSQDs.

A layer comprising a plurality of FSQDs disposed between an electron transport layer (or hole blocking layer) and a hole transport layer, when exposed to photons from a light source, will emit light having a frequency determined by the size of the FSQDs as long as the absorbed wavelength is shorter than the emitted wavelength. Application of a voltage potential across the structure will create a saturation of a larger population of electron or hole pairs (excitons) that quenches the emission of the photonicly excited emission. The light from the light source excites electrons from the ground state of the FSQDs into a higher electric energy/ vibration state. The applied electric field of the voltage potential injects the electrons into free holes (including those in the ground energy state), prohibiting the electrons in a higher energy state to return to the ground energy state. Since photon emission only occurs when the electron relaxes into the ground-level energy state, photon emission is reduced. The level of photon emission from the FSQDs may be controlled by varying the voltage potential.

The exemplary embodiments described herein may be fabricated using known lithographic processes as follows. The fabrication of integrated circuits, microelectronic devices, micro electro mechanical devices, microfluidic devices, and photonic devices, involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photoresist as a template.

Though various lithography processes, e.g., photolithography, electron beam lithography, and imprint lithography, ink jet printing, may be used to fabricate the light emitting device, a printing process is preferred. In the printing process, the FSQD ink in liquid form is printed in desired locations on the substrate. Ink compositions typically comprise four elements: 1) functional element, 2) binder, 3) solvent, and 4) additive. Graphic arts inks and functional inks are differentiated by the nature of the functional element, i.e. the emissive quantum dot. The binder, solvent and additives, together, are commonly referred to as the carrier which is formulated for a specific printing technology e.g. tailored rheology. The function of the carrier is the same for graphic arts and printed electronics: dispersion of functional elements, viscosity and surface tension modification, etc. One skilled in the art will appreciate that an expanded color range can be obtained by using more than three quantum dot inks, with each ink having a different mean quantum dot size. A variety of printing techniques, for example, Flexo, Gravure, Screen, inkjet may be used. The Halftone method, for example, allows the full color range to be realized in actual printing.

Referring to FIG. 1, a cross sectional view of a known light emitting device 100 includes a first electrode 104 formed on a substrate 102. The substrate is formed of a transparent, sturdy, thin material such as glass, but may comprise a flexible polymer such as polyethylene terephthalate (PET) or polyethylene naphthalate (PEN). A hole transport layer 106 is formed on the first electrode 104, for example, indium tin oxide (ITO) or poly-3,4-ethylenedioxthiophene (PEDOT). A layer 108 of a plurality of FSQDs is formed on the hole transport layer 106. Note that the hole and transport layers could also be made of inorganic materials. An electron injection layer 110 and a second electrode 112 are then formed over the layer 108. The substrate 102 typically comprises a transparent material. The first and second electrodes 104, 112 function as an anode and a cathode respectively. The first electrode 104 is transparent while the second electrode 112, is typically opaque.

When the layer 108 of the plurality of FSQDs are impacted with light having a wavelength shorter that which would be emitted by the FSQDs, an electron in each of the FSQDs so impacted is excited to a higher level. When the electron falls back to its ground state, a photon is emitted having a wavelength determined by the diameter of the FSQD.

Figure 2:
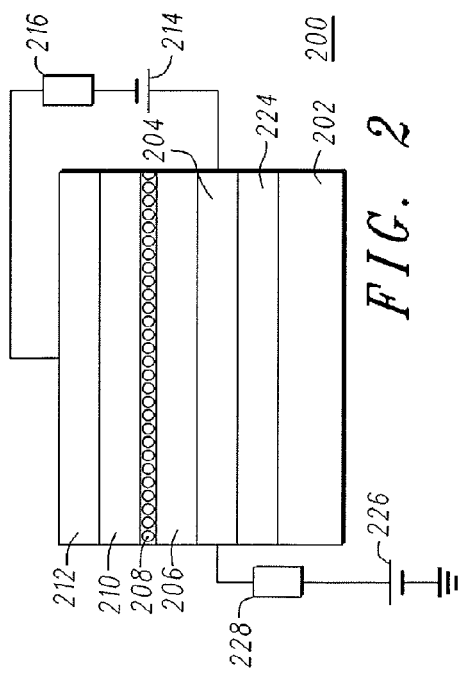
FIG. 2 is a schematic partial cross section illustrating a first exemplary embodiment.

Referring to FIG. 2 and in accordance with a first exemplary embodiment, a cross sectional view of a light emitting device 200 includes a light source 224 deposited on a substrate 212. The light source 224 is coupled to a voltage source 226 through switch 228 for selectively activating the light source 224. It is understood that the light source 224 may be positioned in any location wherein its output may be applied to the FSQDs, and may comprises any frequency below that provided as output from the FSQDs, but preferably comprises ultraviolet (UV) radiation. A first electrode 204 is formed on a light source 224. A hole transport layer 206 is formed on the first electrode 204, but may alternatively comprise an electron blocking layer. A layer 208 of a plurality of FSQDs is formed on the hole transport layer 206. An electron injection layer 210 and a second electrode 212 are then formed over the layer 208. The substrate 202 preferably comprises any transparent material, but may comprise, for example, glass, ceramic, insulated metal, polymers, and polymer composites. The first electrode 204 (anode) comprises a transparent material, preferably indium tin oxide, and has a work function ranging from 4.3-5.1 eV.

The second electrode 212 (cathode) has a lower work function such as Al, Ca, Li, Cs. It is recognized that the substrate 202 may comprise a rigid structure or be flexible, and although is disposed adjacent the first electrode 204, it may alternatively be disposed adjacent the second electrode 212 A voltage source 214 is coupled across the first and second electrodes 204, 212 of the light source 200. A switch 216 may be coupled between the voltage source 214 and one of the first and second electrodes 204, 212 to selectively apply the voltage to the light source 200. Furthermore, the switch 216 may be adjusted to vary the amount of potential provided by the voltage source 214.

In operation, when the layer 208 of the plurality of FSQDs are impacted with light having a wavelength shorter that which would be emitted by the FSQDs, an electron in each of the FSQDs so impacted is excited to a higher level. When the electron falls back to its ground state, a photon is emitted having a wavelength determined by the size of the FSQD. However, the potential supplied to the FSQDs by the voltage source 214 injects electrons into free holes (including those in the ground energy state) of the FSQDs, prohibiting the electrons in a higher energy state to return to the ground energy state. Oversaturation occurs because more electrons are injected than there are holes. Since photon emission only occurs when the electron relaxes into the ground-level energy state, photon emission is reduced. The level of photon emission from the FSQDs may be controlled by varying the voltage potential of the voltage source 214 by the switch 216.

Figure 3:
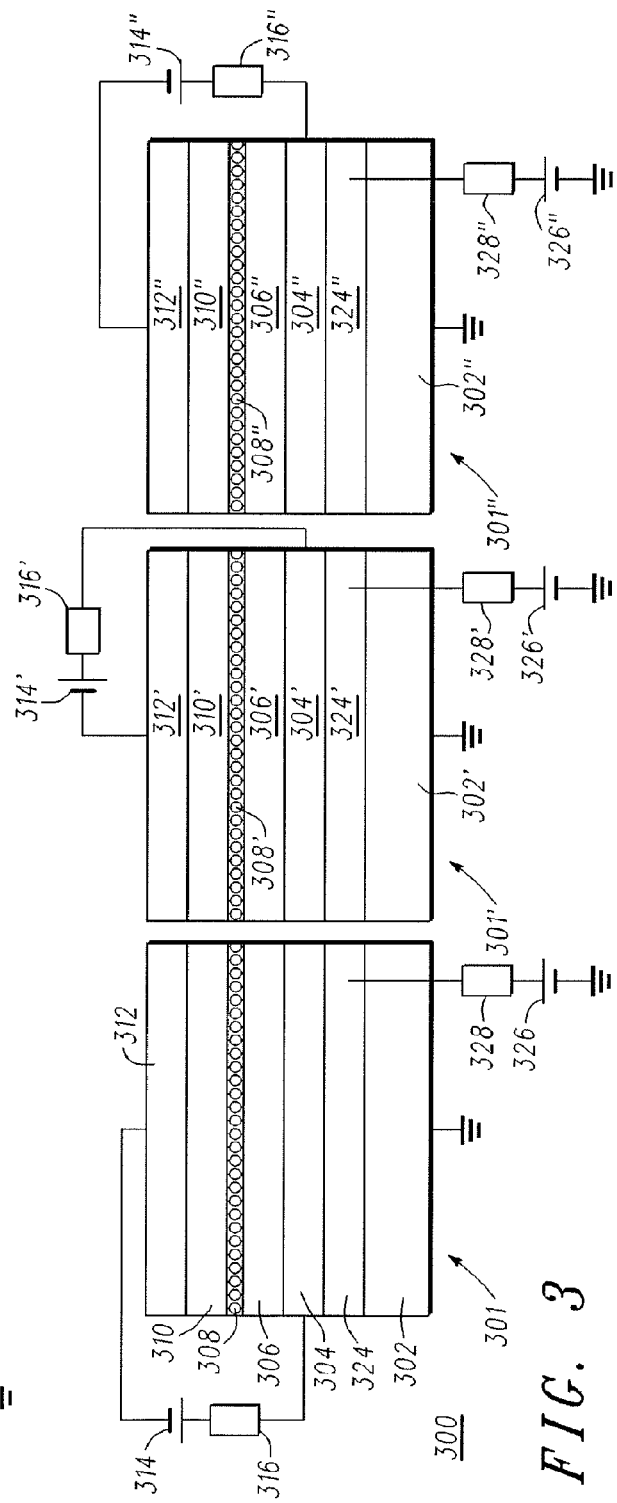
FIG. 3 is a partial cross section of a second exemplary embodiment.

Referring to FIG. 3 and in accordance with a second exemplary embodiment, a cross sectional view includes three segments, or pixels, 301, 301', 301" of a light emitting device 300. The segments 301, 301', 301" are fabricated, or disposed, contiguous to one another in a side by side arrangement. Each of the segments 301, 301', 301" are fabricated similar to the device 200, with each similar element identified by a numerical reference incremented by 100. Similar elements in each of the segments 301, 301', 301" are identified with a number in segment 301, a prime of the number in the segment 301', and a double prime in the segment 301". It should be understood that although three voltage sources 316, 316', 316" are shown, a single voltage source may alternatively supply a potential to each of the three segments 301, 301', 301" through the switches 316, 316', 316". This side by side arrangement allows for each of the segments 300, 301', 301" to be modulated independently by controlling each of the switches 316, 316', 316". This electronic device 300 may be used, for example, on a poster such as in advertising or on a housing of an electronic device such as a cellular phone. By adjusting the switches 16, 316', 316" (potential), the light intensity of each segment 301, 301', 301" may be varied to create lighter and darker areas. This difference in intensity may be used to provide information such as text or to illuminate icons. It may also provide an effect of a moving light by modulating the intensity of the three segments 301, 301', 301" in succession.

Furthermore, since the color of the light emitted by the FSQDs depends on the size of the FSQDs, by fabricating the FSQDs 308, 308', 308" with different diameters, the color presented on the poster or housing may be selected by activating the appropriate switch 314, 314', 314".

Figure 4:
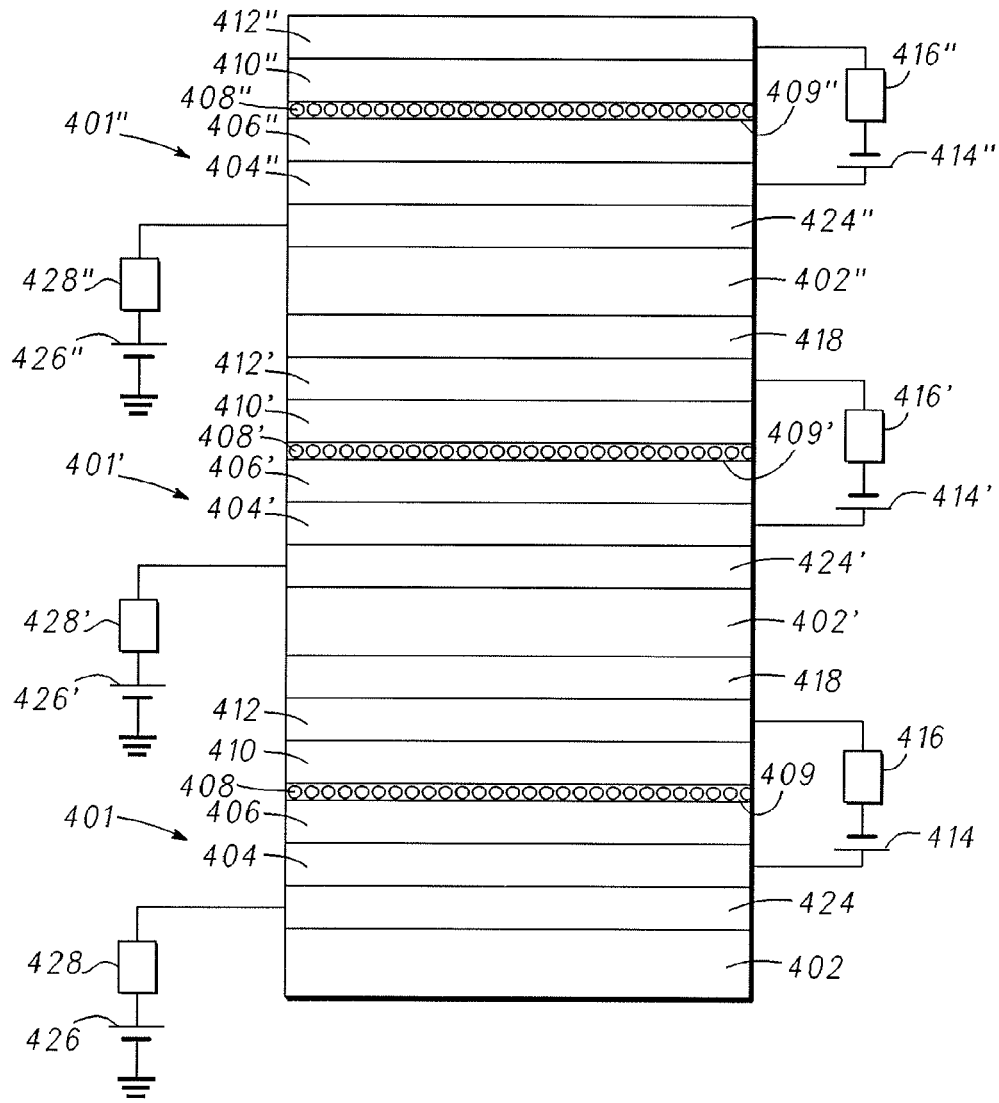
FIG. 4 is a partial cross section of a third exemplary embodiment.

A cross sectional view of a third exemplary embodiment is shown in FIG. 4 three tiers 401, 401', 401" stacked in a single pixel 400. Each of the tiers 401, 401', 401" are fabricated similar to the device 200 and are fastened together, with each similar element identified by a numerical reference incremented by 200 from the numbers in FIG. 2.

One method of fastening is an index-matched optical adhesive 418. Similar elements in each of the tiers 401, 401', 401" are identified with a number in tier 401, a prime of the number in the tier 401', and a double prime in the tier 401". It should be understood that although three voltage sources 416, 416', 416" are shown, a single voltage source may alternatively supply a potential to each of the three segments 401, 401', 401" through the switches 416, 416', 416". This stacked embodiment allows for each of the tiers 400, 401', 401" to be modulated independently by controlling each of the switches 416, 416', 416". It is noted that although three light sources 424, 424', 424" are shown, a different embodiment may comprise only a single light source, e.g., light source 424. It is further noted that in this exemplary embodiment, the electrodes 412, 412', 412" are transparent (though in other embodiments they may be opaque). Transparency may be accomplished, for example, by making the electrode 412, 412', 412" very thin or by using a redox reaction to modify the surface of the material, e.g., indium tin oxide, to decrease the work function down to 3.7 eV.

FSQDs 408, 408', 408" are distributed at a density within a transparent polymer material 409, 409', 409", respectively, that permits photons therethrough. A voltage is applied to the UV light sources 424, 424', 424", causing photons to be emitted, striking the FSQDs 408, 408', 408". Light (photons) are then emitted from the QDs having a predetermined color (frequency) depending on the size of the FSQDs. The density of the FSQDs 408, 408', 408" are such that photons from the UV light sources 424, 424', 424" will be sufficient to strike the FSQDs 408, 408', 408"in each of the tiers 401, 401', 401", with some of the UV photons passing through the lower tiers 401, 401' to reach the upper tiers 401', 401'. The colors provided by the FSQDs 408, 408', 408" are disposed such that the longer wavelength colors are closest to the anode, e.g., cathode-red-green-blue-anode. This prevents the photons (red) emitting from the FSQDs 408 from activating the FSQDs 408' that emit green (red photons will not excite green photons, however green photons will excite the red ones).

Although only one pixel 400 is shown, it should be understood that a large number of pixels may be formed and subdivided into regions with various shapes to permit different areas to display different colors or information.

In operation, when a desired color and/or pattern (including information such as text) is determined, signals are sent to each of the switches 416, 416', 416". As the voltage is applied to the respective tier 401, 401', 401", the electrons enter the FSQDs 408, 408', 408" within that respective tier 401, 401', 401", thereby preventing photons from being emitted. Consequently, different shades of colors (grayscales) are obtained by modulating the applied voltage level. Therefore, by applying the proper signals to each of the tiers 401, 401', 401", the desired color is achieved.

Figure 5:
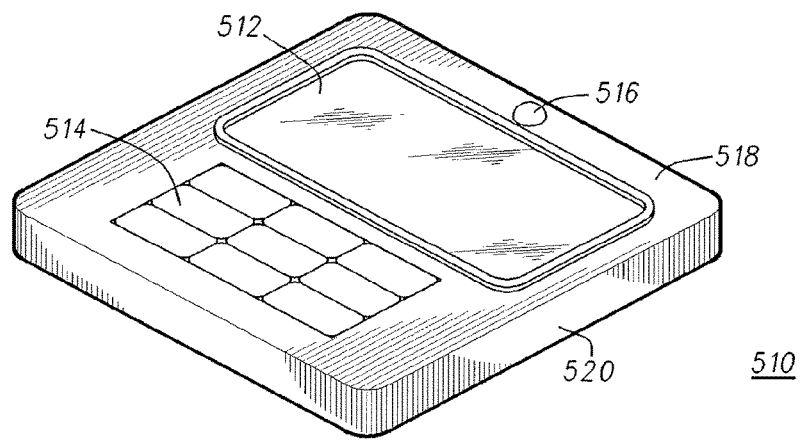
FIG. 5 is a front view of a portable electronic device including a display suitable for use with the exemplary embodiment.

Referring to FIG. 5, a portable electronic device 510 comprises a display 512, a control panel 514, and a speaker 516 encased in a housing 520. Some portable electronic devices 510, e.g., a cell phone, may include other elements such as an antenna, a microphone, and a camera (none shown). In the exemplary embodiments described herein, the display 512 comprises a FSQD display technology. The exemplary embodiment may comprise any type of electronic device, for example, a PDA, a mobile communication device, and gaming devices. Furthermore, while the preferred exemplary embodiment of a portable electronic device is described as a mobile communication device, other embodiments are envisioned, such as flat panel advertising screens, point of purchase and point of sale posters, mobile device housings or logos, segmented displays, including infrared displays, absorbers for infrared sensors or detectors, and light emitting diodes (LEDs).

Figure 6:
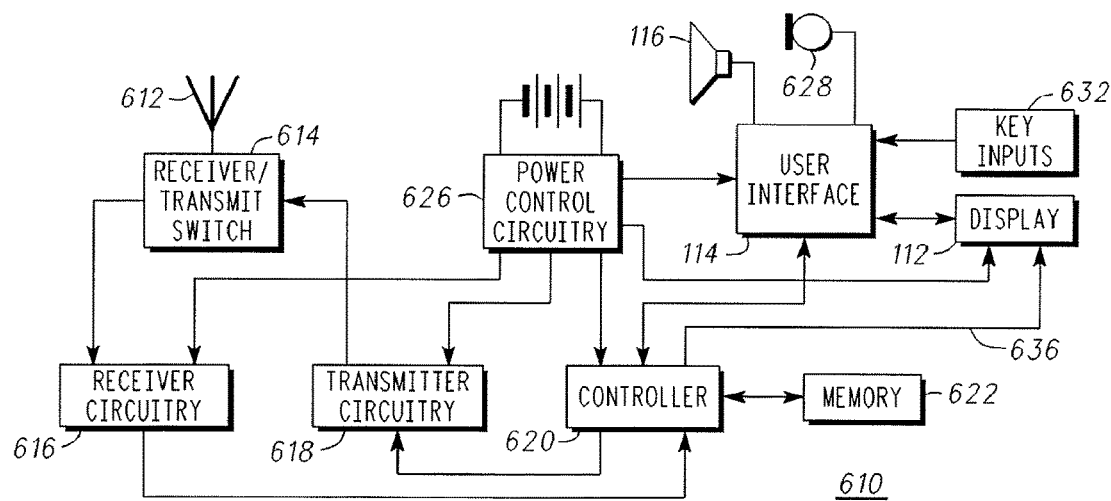
FIG. 6 is a block diagram illustrating circuitry for implementing various exemplary embodiments on the portable electronic device of FIG. 1.

Referring to FIG. 6, a block diagram of a portable electronic device 610 such as a cellular phone, in accordance with the exemplary embodiment is depicted. Though the exemplary embodiment is a cellular phone, the display described herein may be used with any electronic device in which information, colors, or patterns are to be presented. The portable electronic device 610 includes an antenna 612 for receiving and transmitting radio frequency (RF) signals. A receive/transmit switch 614 selectively couples the antenna 612 to receiver circuitry 616 and transmitter circuitry 618 in a manner familiar to those skilled in the art. The receiver circuitry 616 demodulates and decodes the RF signals to derive information therefrom and is coupled to a controller 620 for providing the decoded information thereto for utilization thereby in accordance with the function(s) of the portable communication device 610. The controller 620 also provides information to the transmitter circuitry 618 for encoding and modulating information into RF signals for transmission from the antenna 612. As is well-known in the art, the controller 620 is typically coupled to a memory device 622 and a user interface 114 to perform the functions of the portable electronic device 610. Power control circuitry 626 is coupled to the components of the portable communication device 610, such as the controller 620, the receiver circuitry 616, the transmitter circuitry 618 and/or the user interface 114, to provide appropriate operational voltage and current to those components. The user interface 114 includes a microphone 628, a speaker 116 and one or more key inputs 632, including a keypad. The user interface 114 may also include a display 112 which could include touch screen inputs. The display 112 is coupled to the controller 620 by the conductor 636 for selective application of voltages in some of the exemplary embodiments described above.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A light emitting device disposed comprising:
a first electrode;
a first electron injection layer disposed over the first electrode;
a first layer of a plurality of free standing quantum dots having a size selected for emitting light having a first predetermined wavelength disposed over the electron injection layer;
a first hole transport layer disposed adjacent the first layer of the plurality of quantum dots;
a second electrode disposed over the first hole transport layer;
a light source disposed and configured to apply radiation emitted by the light source to the first layer of the plurality of free standing quantum dots to create a first photon output including the first predetermined wavelength, wherein the radiation emitted by the light source includes a wavelength shorter than the first predetermined wavelength, the application of radiation to the first layer of the plurality of free standing quantum dots being controlled by a switch connected to a first voltage source for selectively activating the light source; and
a switching device coupled between the first and second electrodes and configured to be coupled to a second voltage source for modulating intensity of the first photon output created by the application of radiation to the first layer of the plurality of free standing quantum dots by adjusting the magnitude of a first plurality of electrons injected into the free standing quantum dots to provide a desired first photon output intensity,
wherein the application of radiation to the first plurality of free standing quantum dots and the injection of the first plurality of electronics into the first plurality of free standing quantum dots are separately controlled.

2. The light emitting device of claim 1 wherein the switching device may be adjusted to provide different voltages to the first and second electrodes.

3. The light emitting device of claim 1 further comprising:
a third electrode spatially disposed from the second electrode;
a second electron injection layer disposed over the second electrode;
a second layer of a plurality of free standing quantum dots disposed over the second electron injection layer, the second layer of a plurality of free standing quantum dots being disposed contiguous to the first layer of a plurality of free standing quantum dots;
a second hole transport layer disposed over the second layer of a plurality of quantum dots; and
a fourth electrode disposed over the second hole transport layer;
the light source disposed and configured to apply radiation to the second layer of a plurality of free standing quantum dots;
a second switching device coupled between the third and fourth electrodes and configured to be coupled to the second voltage source.

4. The light emitting device of claim 3 wherein the first and second layers are disposed adjacent to one another.

5. The light emitting device of claim 3 further comprising:
a fifth electrode spatially disposed from the fourth electrode;
a third electron injection layer disposed over the fifth electrode;
a third layer of a plurality of free standing quantum dots disposed over the third electron injection layer, the third layer of a plurality of free standing quantum dots being disposed contiguous to the second layer of a plurality of free standing quantum dots;
a third hole transport layer disposed over the third layer of a plurality of quantum dots;
a sixth electrode disposed over the third hole transport layer;
the light source disposed and configured to apply radiation to the third layer of a plurality of free standing quantum dots; and
a third switching device coupled between the fifth and sixth electrodes and configured to be coupled to the second voltage source.

* * * * *